US006507206B1

(12) United States Patent
Vesaruch et al.

(10) Patent No.: US 6,507,206 B1
(45) Date of Patent: Jan. 14, 2003

(54) AUTOMATED PREVENTION OF TRANSFER OF AN UNSOAKED IC PACKAGE FROM A TEMPERATURE SOAKING CHAMBER TO A TESTING CHAMBER

(75) Inventors: Supachai Vesaruch, Pathumtani (TH); Kittinan Chanvivatkun, Nonthaburi (TH); Nopadon Upakaew, Nonthaburi (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 296 days.

(21) Appl. No.: 09/690,080

(22) Filed: Oct. 16, 2000

(51) Int. Cl.[7] .................... G01R 31/02

(52) U.S. Cl. .................... 324/760; 324/158.1; 324/765

(58) Field of Search .................... 324/158.1, 760, 324/765; 209/573; 221/12, 15, 83

(56) References Cited

U.S. PATENT DOCUMENTS

| | | | | |
|---|---|---|---|---|
| 4,588,092 A | * | 5/1986 | Moechnig et al. | 324/158.1 |
| 4,926,118 A | * | 5/1990 | O'Connor et al. | 209/573 |
| 5,261,775 A | * | 11/1993 | Kobayashi | 324/158.1 |
| 5,307,011 A | | 4/1994 | Tani | 324/158.1 |

FOREIGN PATENT DOCUMENTS

| | | | |
|---|---|---|---|
| WO | 92/04989 | 4/1992 | G01R/31/28 |

* cited by examiner

*Primary Examiner*—Ernest Karlsen

(74) *Attorney, Agent, or Firm*—Monica H. Choi

(57) ABSTRACT

For ensuring that each of a plurality of IC (integrated circuit) packages are placed within a temperature soaking chamber for a predetermined time period before being transferred to a testing chamber, an input stopper device is disposed at an input of a track with the track being disposed through the temperature soaking chamber. A prior container holding a prior plurality of IC packages is placed at the input of the track such that the prior plurality of IC packages slides out of the prior container along the track into the soaking chamber when the input stopper device is at a passing position. The prior plurality of IC packages is placed within the soaking chamber for the predetermined time period before each of the prior plurality of IC packages is transferred to the testing chamber when an output stopper device at an output of the track within the soaking chamber is placed to a passing position. A control unit, coupled to the input stopper device, controls the input stopper device to be at a stopping position until each of the prior plurality of IC packages has been transferred to the testing chamber and until the output stopper device is placed to a stopping position when the control unit controls the input stopper device to be at the passing position. Thus, each of a subsequent plurality of IC packages within a subsequent container is blocked, by the input stopper device, to be contained within the subsequent container placed at the input of the track until each of the prior plurality of IC packages within the soaking chamber has been transferred to the testing chamber. In addition, each of the subsequent plurality of IC packages is blocked by the output stopper device from being transferred to the testing chamber until the subsequent plurality of IC packages has been within the soaking chamber for the predetermined time period.

15 Claims, 10 Drawing Sheets

AUTOMATED PREVENTION OF TRANSFER OF AN UNSOAKED IC PACKAGE FROM A TEMPERATURE SOAKING CHAMBER TO A TESTING CHAMBER

TECHNICAL FIELD

The present invention relates generally to manufacture of IC (integrated circuit) packages, and more particularly, to a mechanism for automatically preventing the transfer of an IC package from a temperature soaking chamber to a testing chamber when the IC package has not been placed within the temperature soaking chamber for a predetermined time period.

BACKGROUND OF THE INVENTION

Referring to FIG. 1, during manufacture of IC (integrated circuit) packages, the IC packages are tested for proper functionality at a range of temperatures such as from about −40° Celsius to about +85° Celsius, for example. An example testing system that handles the IC packages for such testing of the IC packages for a range of temperatures is the MCT3608E Handler or the MCT3608CCA Handler available from Micro Component Technology, Inc. headquartered in St. Paul, Minn.

Referring to FIG. 1, such a temperature testing system 100 includes a testing chamber 102 and a temperature soaking chamber 104 having a heating or cooling grid 106. The heating or cooling grid 106 is heated or cooled such that the temperature within the soaking chamber 104 is at a predetermined temperature. IC packages are heated or cooled to the predetermined temperature within the soaking chamber 104 by placing the IC packages within the soaking chamber 104 for a predetermined time period. Such a process of heating or cooling the IC packages within the soaking chamber 104 is referred to as "soaking" the IC packages by one of ordinary skill in the art of IC package manufacture.

After the IC packages have been heated or cooled to the predetermined temperature within the soaking chamber 104, the IC packages are transferred to the testing chamber 102 for testing of electrical characteristics of the IC packages when the IC packages are at that predetermined temperature, as known to one of ordinary skill in the art of IC package manufacture. Referring to FIG. 1, the temperature testing system 100 includes a plurality of tracks including a first track 108 and a second track 110 for holding the IC packages through the temperature soaking chamber 104 to the testing chamber 102. A temperature testing system, such as the MCT3608E Handler or the MCT3608CCA Handler available from Micro Component Technology, Inc., typically includes more numerous tracks, such as thirteen tracks for example, but two tracks 108 and 110 are shown in FIG. 1 for clarity of illustration.

Each of the tracks 108 and 110 includes a respective input with a first input 112 for the first track 108 and a second input 114 for the second track 110. A container such as an IC tube for holding the IC packages is placed on the input of a track for transferring the IC packages from the container to the temperature soaking chamber 104. Referring to FIG. 1, a first prior IC tube 116 is placed on the first input 112 of the first track 108, and a second prior IC tube 118 is placed on the second input 114 of the second track 110. Referring to FIGS. 1 and 2, the IC packages from the first prior IC tube 112 are transferred to the first track 108 within the soaking chamber 104, and the IC packages from the second prior IC tube 114 are transferred to the second track 110 within the soaking chamber 104. Elements having the same reference number in FIGS. 1 and 2 refer to elements having similar structure and function.

Referring to FIG. 3, a side view of the temperature testing system 100 shows the IC packages, from the first prior IC tube 116 placed at the first input 112, sliding out of the first prior IC tube 116 and onto the first track 108 within the temperature soaking chamber 104. The side view of any track of the temperature testing system 100 including the second track 110 is similar to the side view of the first track 108 as illustrated in FIG. 3. Elements having the same reference number in FIGS. 1, 2, and 3 refer to elements having similar structure and function. An IC package detector 120 is disposed within the temperature soaking chamber near a first output stopper device 122 at the output of the first track 108. Referring to FIGS. 1 and 2, the first output stopper device 122 is at the output of the first track 108, and the second output stopper device 124 is at the output of the second track 110. The output of a track is the end of the track within the soaking chamber 104 near the testing chamber 102.

Referring to FIGS. 3 and 4, the IC package detector 120 is a position sensor such as an opto-electronic position sensor that detects when an object is adjacent to the IC package detector 120. Such position sensors are known to one of ordinary skill in the art of electronics. Referring to FIG. 4, when the track 108 is full of IC packages with an IC package being adjacent the IC package detector 120, the IC package detector 120 sends an "IC package PRESENT" control signal to a data processor 126 of the temperature testing system 100 to indicate that the soaking chamber 104 is full of newly transferred IC packages. Elements having the same reference number in FIGS. 1, 2, 3, and 4 refer to elements having similar structure and function.

The data processor 126 then starts a timer that times up to a predetermined time period from when the IC package detector 120 sends the "IC package PRESENT" control signal to the data processor 126 such that the IC packages on the track 108 are "soaked" to the predetermined temperature of the soaking chamber 104 by being placed within the soaking chamber 104 for the predetermined time period. For example, the predetermined time period may be about 4 minutes.

Referring to FIG. 5, after the predetermined time period from when the IC package detector 120 sends the "IC package PRESENT" control signal, the data processor 126 controls the output stopper device to be lowered to a passing position such that the IC packages on the track 108 may be transferred to the testing chamber 102. The IC packages are then transferred from the soaking chamber 104 to the testing chamber 102 for electrical testing of the IC packages at the predetermined temperature. Elements having the same reference number in FIGS. 1, 2, 3, 4, and 5 refer to elements having similar structure and function.

Referring to FIGS. 3, 5, and 6, as the IC packages of the first prior IC tube 116 are transferred to the testing chamber 102 after such IC packages have been soaked within the soaking chamber 104 for the predetermined time period, a subsequent IC tube 130 may be placed on the input 112 of the track 108. Elements having the same reference number in FIGS. 1, 2, 3, 4, 5, and 6 refer to elements having similar structure and function. The elements of the prior art temperature testing system 100, such as the elements of the MCT3608E Handler or the MCT3608CCA Handler available from Micro Component Technology, Inc., of FIGS. 1,

2, 3, 4, 5, and 6 are known to one of ordinary skill in the art of IC package manufacture In the prior art temperature testing system 100, an operator keeps track of when the IC packages of the subsequent IC tube 130 are to be placed within the soaking chamber 104 after each of the IC packages of the first prior IC tube 116 has been transferred to the testing chamber 102. However, the operator may erroneously place the subsequent IC tube 130 of IC packages on the input 112 of the track 108 before each of the IC packages of the first prior IC tube 116 has been transferred to the testing chamber 102 as illustrated in FIG. 6.

In that case, the IC packages of the subsequent IC tube 130 are transferred onto the track 108 and may be transferred to the testing chamber 102 without being soaked within the soaking chamber 104 for the predetermined time period. The IC packages of the subsequent IC tube 130 that have not been properly soaked to the predetermined temperature of the soaking chamber 104 are tested in the testing chamber 102 when such IC packages are at an inappropriate temperature resulting in inaccurate testing of such IC packages.

Thus, a mechanism is desired for ensuring that the IC packages of the subsequent IC tube 130 are not transferred to the testing chamber 102 when such IC packages have not been soaked for the predetermined time period within the temperature soaking chamber 104.

SUMMARY OF THE INVENTION

Accordingly, in one embodiment of the present invention, a method and system includes a respective input stopper device at each input of the tracks for ensuring that each of a plurality of IC (integrated circuit) packages are placed within a temperature soaking chamber for the predetermined time period before being transferred to the testing chamber.

In a general aspect of the present invention, an input stopper device is disposed at an input of a track with the track being disposed through the temperature soaking chamber. A prior container holding a prior plurality of IC packages is placed at the input of the track such that the prior plurality of IC packages slides out of the prior container along the track into the soaking chamber when the input stopper device is at a passing position. The prior plurality of IC packages is placed within the soaking chamber for the predetermined time period before each of the prior plurality of IC packages is transferred to the testing chamber when an output stopper device at an output of the track within the soaking chamber is placed to a passing position. A control unit, coupled to the input stopper device, controls the input stopper device to be at a stopping position when any of the prior plurality of IC packages is within the soaking chamber and has not been transferred to the testing chamber. Thus, each of a subsequent plurality of IC packages of a subsequent container is blocked, by the input stopper device, to be contained within the subsequent container placed at the input of the track until each of the prior plurality of IC packages within the soaking chamber has been transferred to the testing chamber.

In addition, the control unit controls the input stopper device to be at the passing position after each of the prior plurality of IC packages has been transferred to the testing chamber and after the output stopper device is placed to a stopping position. Thus, each of the subsequent plurality of IC packages slides from the subsequent container along the track into the soaking chamber. Furthermore, each of the subsequent plurality of IC packages is blocked by the output stopper device from being transferred to the testing chamber until the subsequent plurality of IC packages has been within the soaking chamber for the predetermined time period.

In another aspect of the present invention, an IC package detector is disposed at the output of the track within the soaking chamber for detecting whether an IC package is present at the output of the track within the soaking chamber. In that case, the control unit controls the input stopper device to be at the stopping position when the IC package detector detects that an IC package is present at the output of the track indicating that any of the prior plurality of IC packages is within the soaking chamber. The output stopper device is placed to a stopping position after the IC package detector detects that no IC package is present at the output of the track. Furthermore, the control unit controls the input stopper device to be at the passing position when the IC package detector detects that no IC package is present at the output of the track and after the output stopper device has been placed to the stopping position.

The present invention may be used to particular advantage when the control unit includes a 5 second timer such that the input stopper device is placed to the stopping position about 5 seconds after the IC package detector begins to detect that an IC package is at the output of the track within the soaking chamber. Thus, all of the prior plurality of IC packages is placed within the soaking chamber before the input stopper device is placed to the stopping position.

Additionally, the control unit may include a 10 second timer such that the input stopper device is placed to the passing position about 10 seconds after the IC package detector begins to detect that no IC package is at the output of the track within the soaking chamber. Thus, the output stopper device is put to the stopping position before the input stopper device is placed to the passing position.

In this manner, each of the IC packages of the subsequent IC package container placed at the input of the track is blocked by the input stopper device from entering the temperature soaking chamber until each of the IC packages of the prior IC package container has been transferred to the testing chamber and until the output stopper device has been placed to the stopping position. After each of the IC packages of the prior IC package container has been transferred to the testing chamber and after the output stopper device has been placed to the stopping position, the input stopper device is placed to the passing position such that the IC packages of the subsequent IC package container are transferred to the soaking chamber. Then, after such IC packages have been within the soaking chamber for the predetermined time period, the output stopper device is placed to the passing position such that the IC packages of the subsequent IC package container are transferred to the testing chamber. Thus, each of the IC packages of the prior IC package container and the subsequent IC package container is placed within the soaking chamber for the predetermined time period before being transferred to the testing chamber for testing of the IC packages at the proper temperature.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, and 13 refer to elements having similar structure and function.

DETAILED DESCRIPTION

Figure 1:
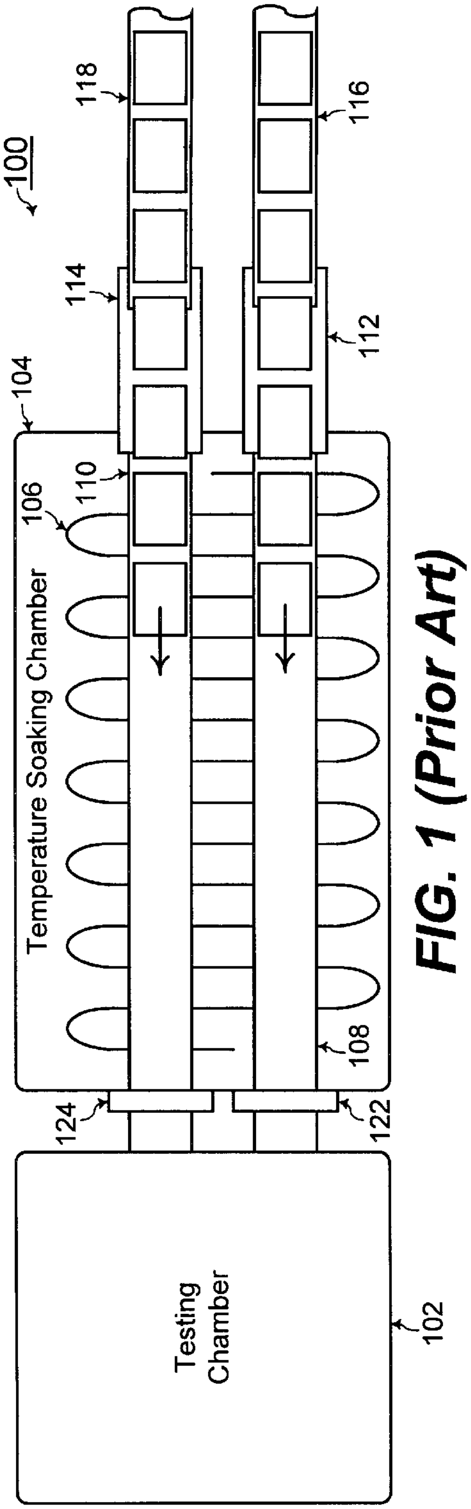
FIG. 1 (Prior Art)
FIG. 1 shows a top view of a temperature testing system of the prior art having a temperature soaking chamber and a testing chamber for testing IC packages at a range of temperatures.
Figure 2:
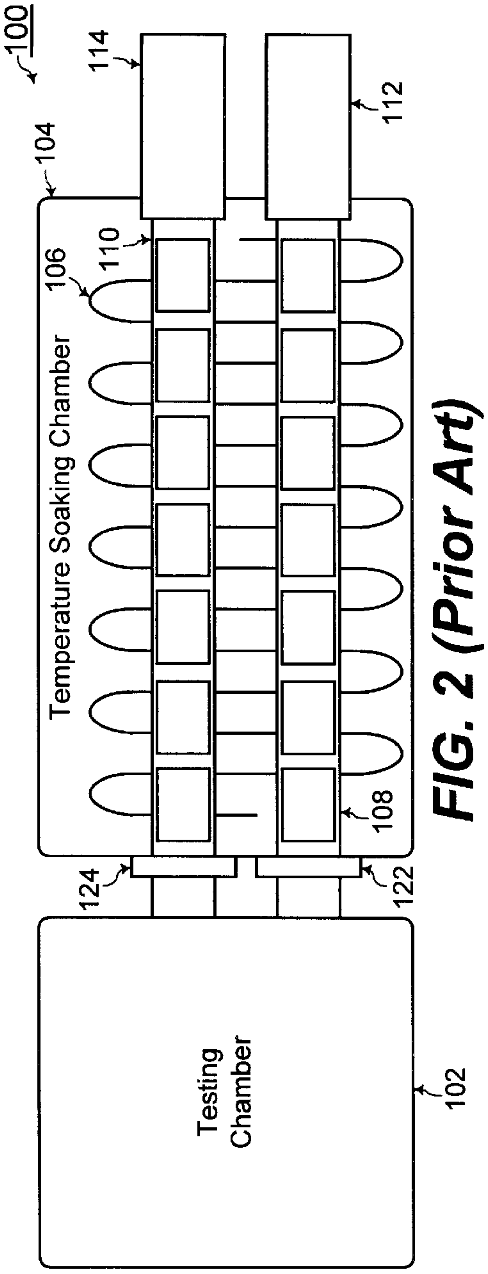
FIG. 2 (Prior Art)
FIG. 2 shows the temperature testing system of FIG. 1 with each of the IC packages transferred from IC tubes to the temperature soaking chamber.
Figure 3:
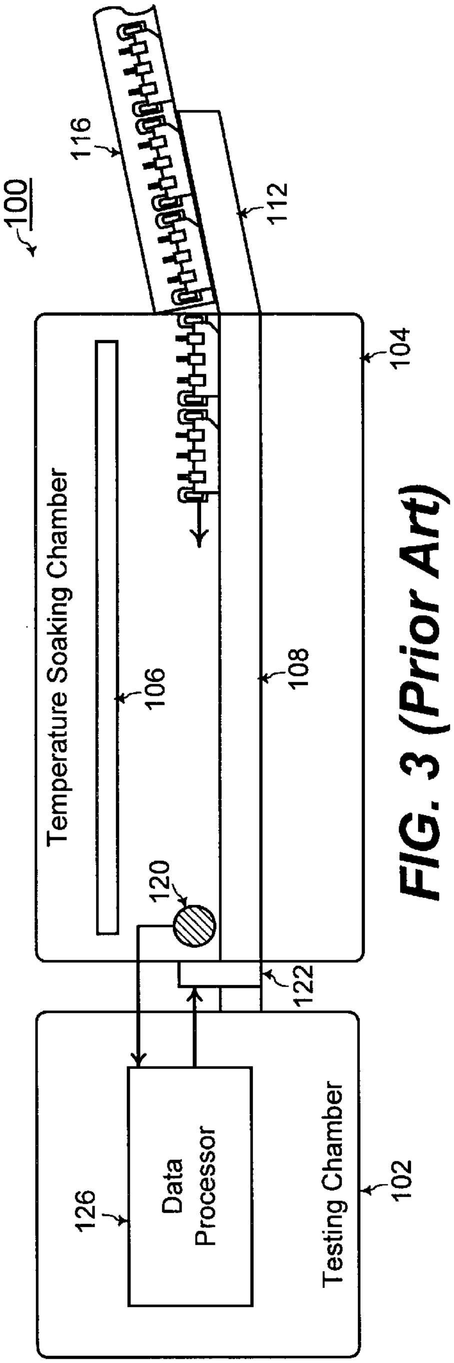
FIG. 3 (Prior Art)
FIG. 3 shows a side view of the temperature testing system of FIG. 1 as the IC packages from a prior IC tube are transferred into the temperature soaking chamber.
Figure 4:
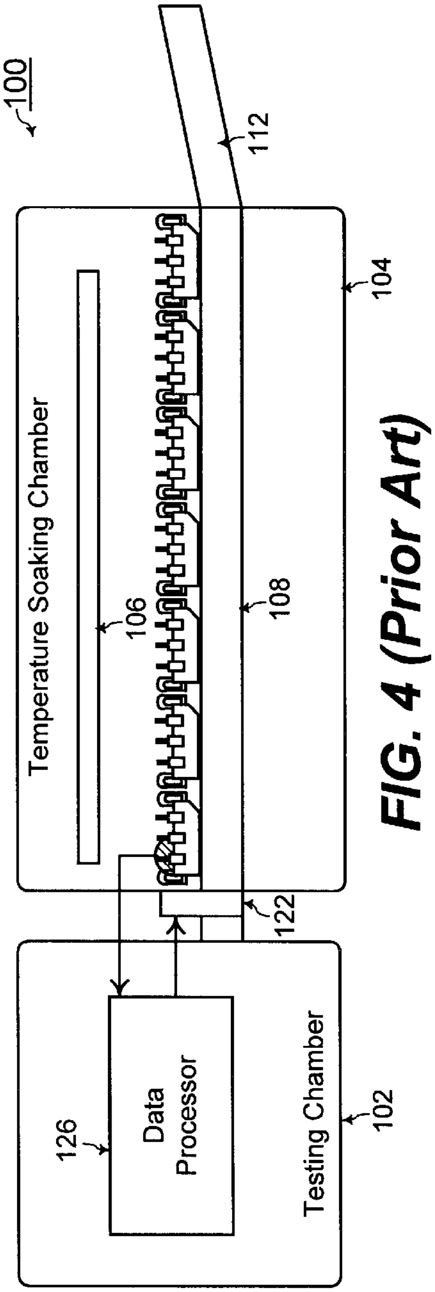
FIG. 4 (Prior Art)
FIG. 4 shows the side view of the temperature testing system of FIG. 3 after each of the IC packages of the prior IC tube has been transferred into the temperature soaking chamber.
Figure 5:
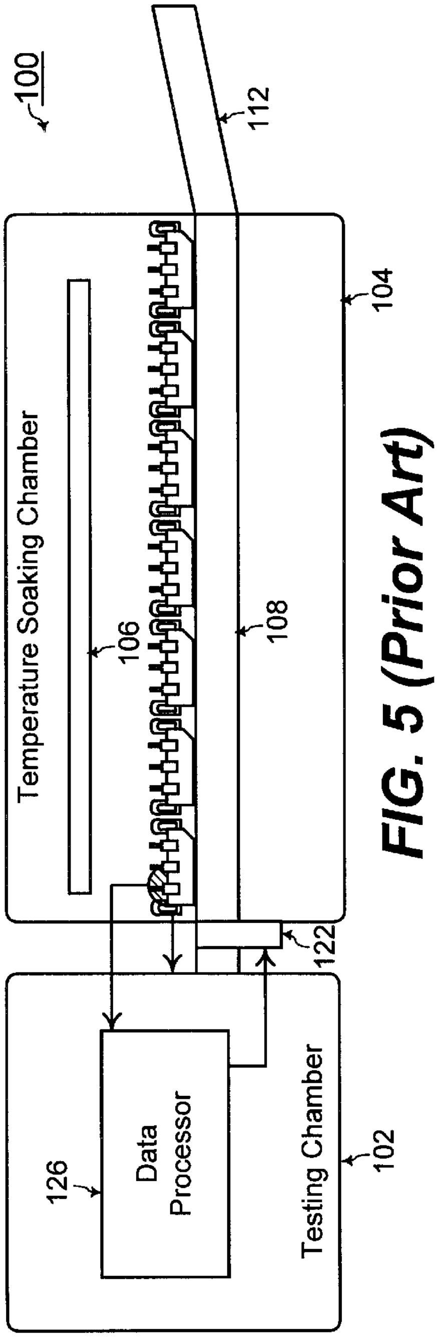
FIG. 5 (Prior Art)
FIG. 5 shows the side view of the temperature testing system of FIG. 4 after each of the IC packages of the prior IC tube has been placed within the temperature soaking chamber for a predetermined time period when an output stopper device is placed to a passing position such that the IC packages may be transferred to the testing chamber.
Figure 6:
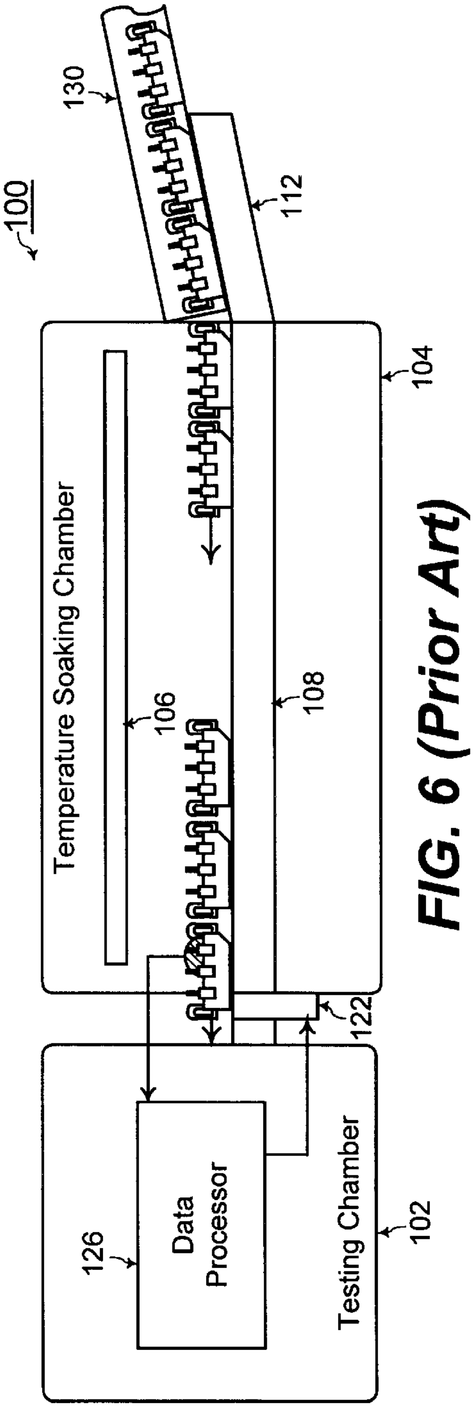
FIG. 6 (Prior Art)
FIG. 6 shows the side view of the temperature testing system of FIG. 5 with transfer of IC packages to the temperature soaking chamber from a subsequent IC tube as the IC packages of the prior IC tube are being transferred to the testing chamber, according to the prior art.
Figure 7:
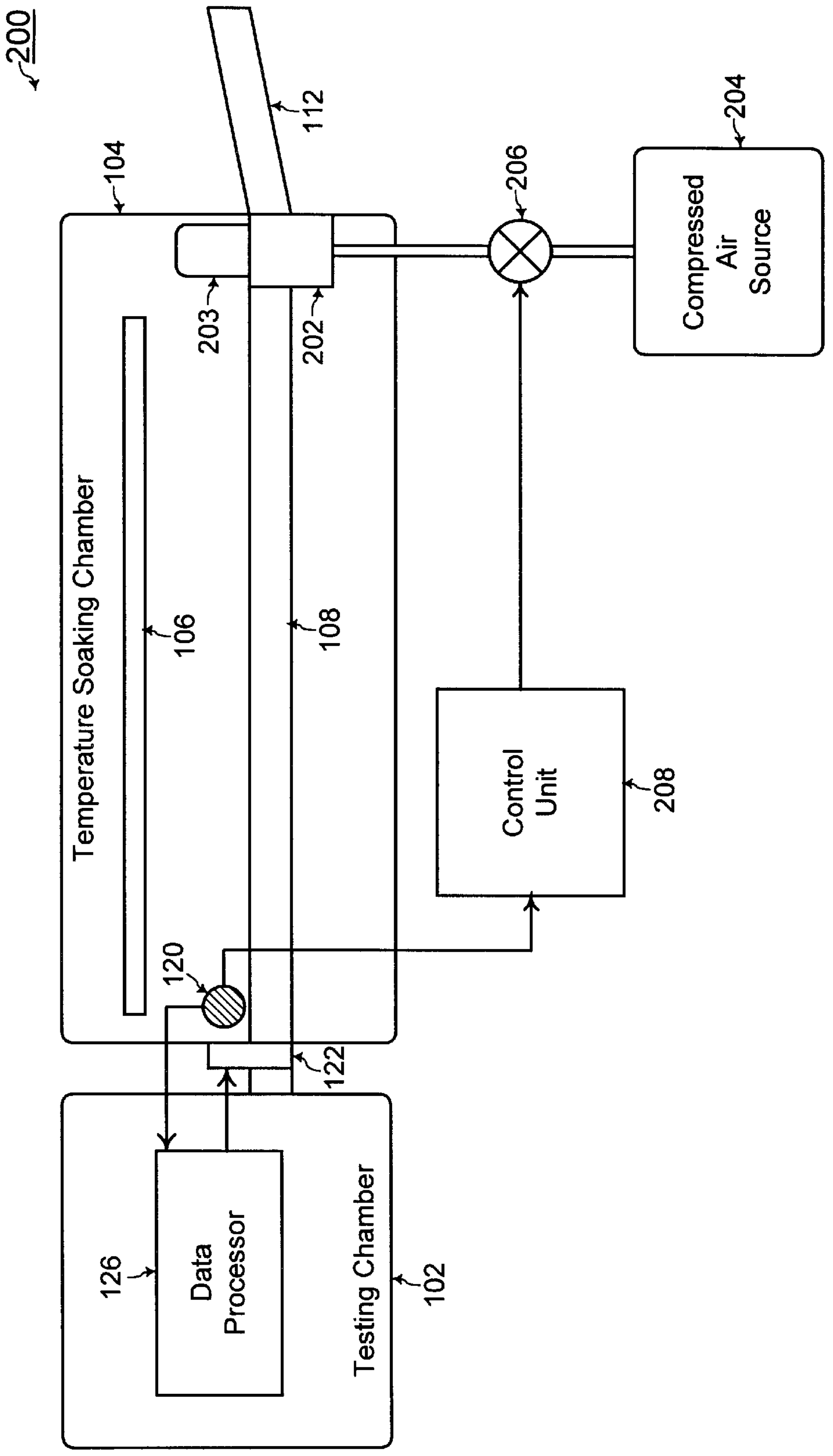
FIG. 7 shows an input stopper device placed at the input of a track into the temperature soaking chamber and a control unit for controlling the input stopper device to block IC packages of the subsequent IC tube from entering the temperature soaking chamber until each of the IC packages of the prior IC tube has been transferred to the testing chamber, according to an embodiment of the present invention.

Referring to FIG. 7, components of a temperature testing system 200 for ensuring that each IC package is soaked within the temperature soaking chamber 104 for the predetermined time period is described and illustrated for the first track 108 as an example track through the temperature soaking chamber 104. However, such respective components may be included for each of the tracks through the temperature soaking chamber 104 for ensuring that each IC package through each of the tracks is soaked within the temperature soaking chamber 104 for the predetermined time period before being transferred to the testing chamber 102, as would be apparent to one of ordinary skill in the art of IC package manufacture from the description herein for the example first track 108.

Referring to FIG. 7, the temperature testing system 200 includes the testing chamber 102 and the temperature soaking chamber 104 as described for the temperature testing system 100 of FIGS. 1, 2, 3, 4, 5, and 6 with the same reference number in FIGS. 1, 2, 3, 4, 5, 6, and 7 referring to elements having similar structure and function. However, the temperature testing system 200 includes additional components from the prior art temperature testing system 100 for ensuring that each IC package through each of the tracks is soaked within the temperature soaking chamber 104 for the predetermined time period before being transferred to the testing chamber 102.

In FIG. 7, an input stopper device 202 is included at the input 112 of the track 108 that is placed to a stopping position or a passing position. The input stopper device 202 in one embodiment of the present invention includes a pneumatic cylinder 203 that is raised to be in the stopping position or that is lowered to be in the passing position. In that case, the pneumatic cylinder 203 of the input stopper device 202 is coupled to a compressed air source 204 via an air valve 206. The air valve 206 is adjusted to control the amount of compressed air to the pneumatic cylinder 203 of the input stopper device 202 from the compressed air source 204. The amount of air to the pneumatic cylinder 203 of the input stopper device 202 determines whether the pneumatic cylinder 203 is raised to be in the stopping position or lowered to be in the passing position. Technology for such operation of the pneumatic cylinder 203, the air valve 206, and the compressed air source 204 is known to one of ordinary skill in the art of mechanics.

A control unit 208 is coupled to the air valve 206 for sending a control signal that adjusts the air valve 206 for controlling the amount of compressed air to the pneumatic cylinder 203 from the compressed air source 204. Thus, the control unit 208 controls whether the pneumatic cylinder 203 of the input stopper device 202 is raised to be in the stopping position or lowered to be in the passing position. In addition, the control unit 208 is coupled to the IC package detector 120 for receiving a control signal that is in one of two states, "IC package PRESENT" or "IC package NOT PRESENT," for indicating whether the pneumatic cylinder 203 of the input stopper device 202 is to be raised to be in the stopping position or lowered to be in the passing position.

Figure 8:
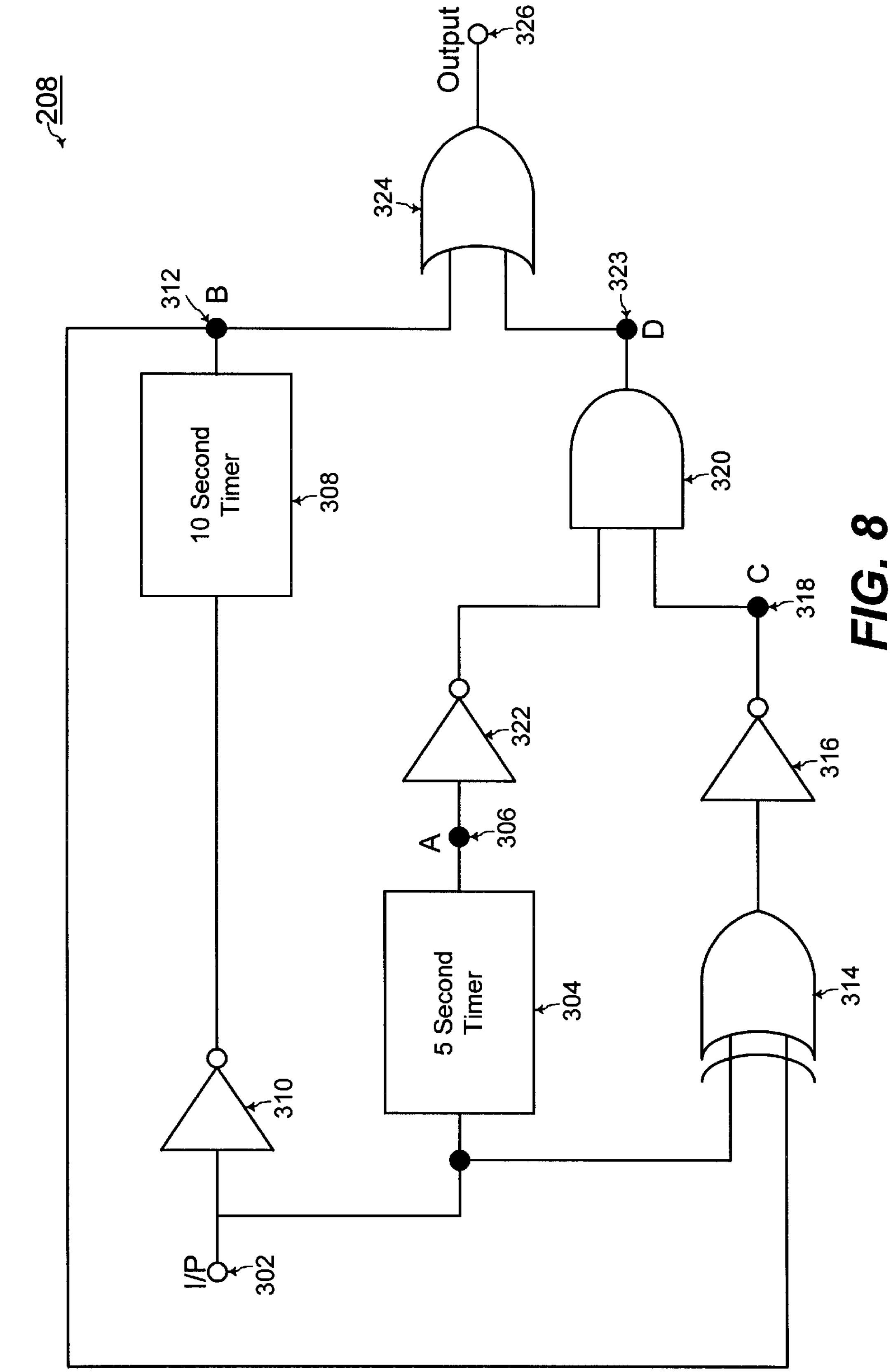
FIG. 8 shows components of an example circuit of the control unit of FIG. 7 for generating the control signals for controlling the input stopper device of FIG. 7.

Referring to FIG. 8, an example embodiment of the control unit 208 includes an "I/P" (input) node 302 that is coupled to the IC package detector 120 for receiving the control signal that is in one of two states, "IC package PRESENT" or "IC package NOT PRESENT." The I/P node 302 is coupled to a five second timer 304 for generating a control signal A at the output node 306 of the five second timer 304. In addition, the I/P node 302 is coupled to a ten second timer 308 via a first inverter 310 to generate a control signal B at the output node 312 of the ten second timer 308.

The I/P node 302 and the output node 312 of the ten second timer 308 are coupled to the inputs of an exclusive OR-gate 314. The output of the exclusive OR-gate 314 is coupled to a second inverter 316 to generate a control signal C at the output node 318 of the second inverter 316. The output node 306 of the five second timer 304 is coupled to an input of an AND-gate 320 through a third inverter 322, and the output node 318 of the second inverter 316 is the other input to the AND-gate 320, to generate a control signal D at the output node 323 of the AND-gate 320. The output node 312 of the ten second timer 308 and the output node 323 of the AND-gate 320 are coupled as inputs of an OR-gate 324 to generate an output Control signal at the output node 326 of the OR-gate 324. The output node 326 of the OR-gate 324 is coupled to the air valve 206. Logic gates such as exclusive OR-gates, AND-gates, OR-gates, and inverters are known to one of ordinary skill in the art of electronics.

Figure 9:
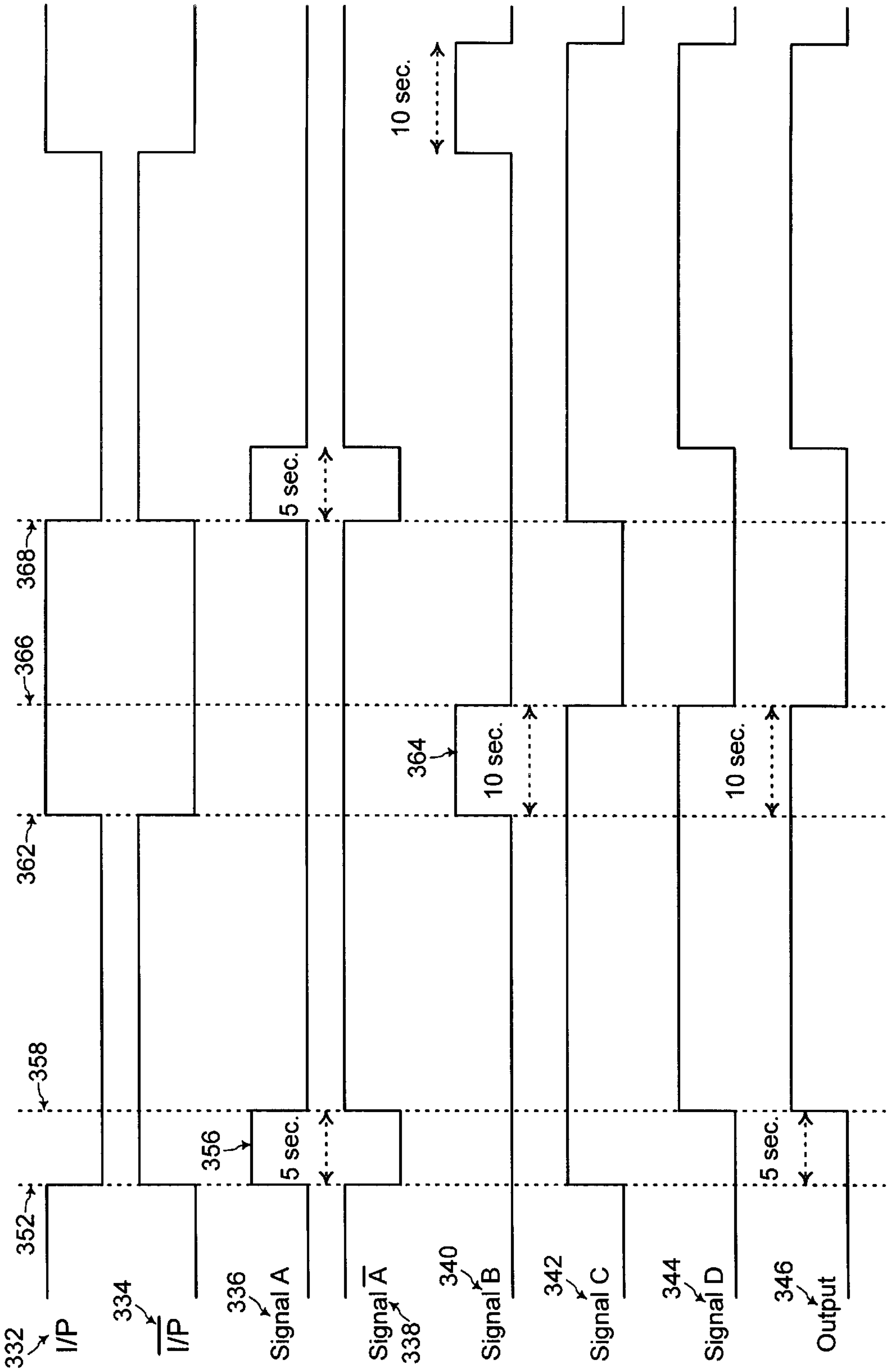
FIG. 9 shows a timing diagram of the control signals generated by the control circuit of FIG. 8.

During operation of the temperature testing system 200 of an embodiment of the present invention, FIG. 9 shows a timing diagram of the controls signals generated by the control unit 208 of FIG. 8. Referring to FIG. 9, a first signal 332 ("I/P") of the timing diagram of FIG. 9 is the control signal I/P at the input node 302, and a second signal 334 is the inverse of the first signal 332. A third signal ("Signal A") 336 is the control signal A at the output node 306 of the five second timer 304, and a fourth signal 338 is the inverse of the third signal 336. A fifth signal 340 ("Signal B) is the control signal B at the output node 312 of the ten second timer 308. A sixth signal 342 ("Signal C") is the control signal C at the output node 318 of the second inverter 316. A seventh signal 344 ("Signal D") is the control signal D at the output node 323 of the AND-gate 320, and an eighth signal 346 ("Output) is the output control signal at the output node 326 of the OR-gate 324.

Referring to FIGS. 7, 8, 9, and 10, before a first time point 352, the control signal I/P at the I/P node 302 from the IC package detector 120 is at the "IC package NOT PRESENT" (i.e., high) state indicating that no IC package is present on the track 108 within the temperature soaking chamber 104. Thus, before the time point 352, the output control signal at the output node 326 of the OR-gate 324 is low. The output node 326 of the OR-gate 324 is coupled to the air valve 206, and when the output control signal at the output node 326 is low, the air valve 206 is closed to minimize the amount of compressed air to the pneumatic cylinder 203 of the input stopper device 202 from the compressed air source 204.

Figure 10:
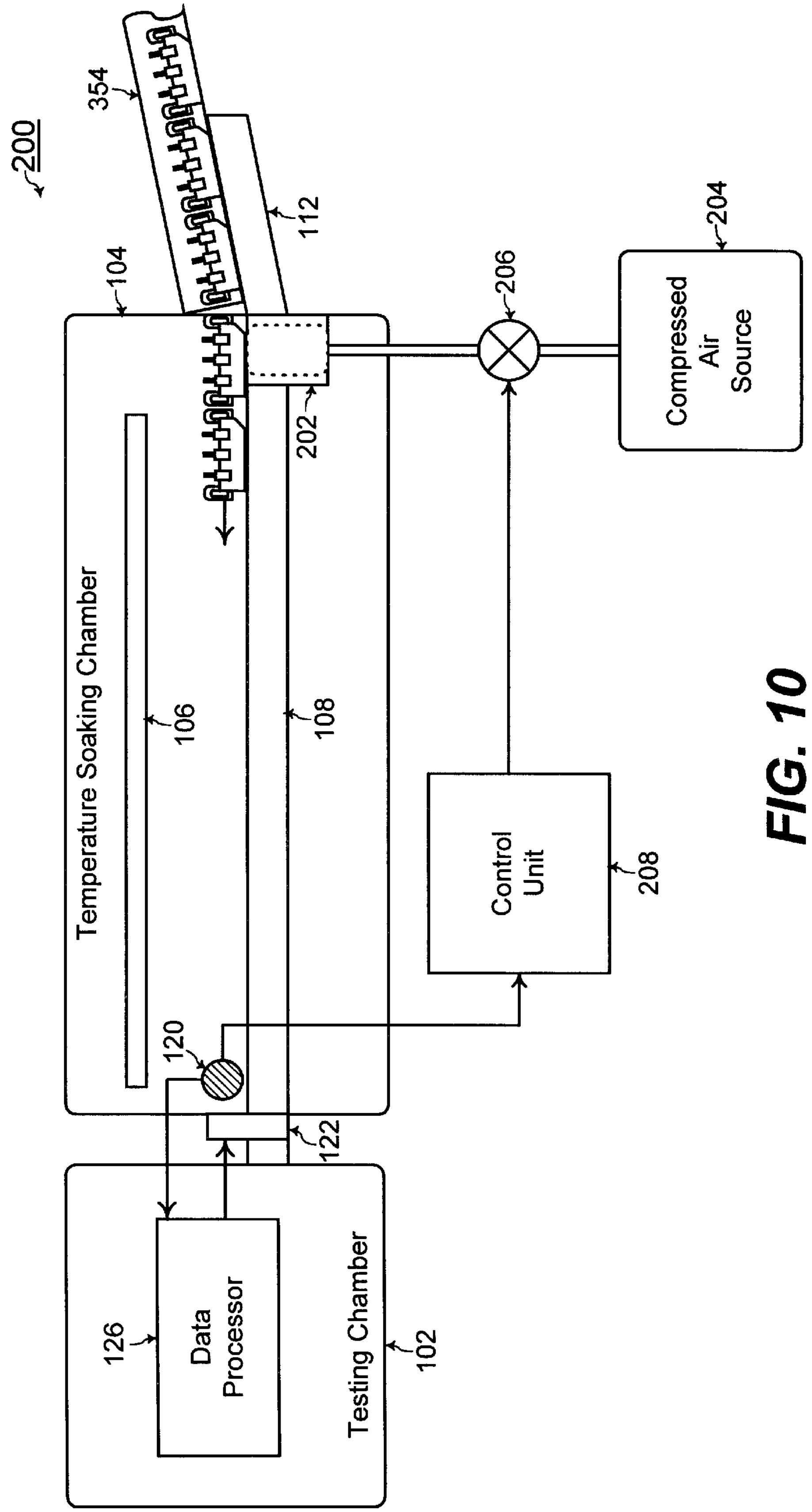
FIG. 10 shows a side view of the temperature testing system with the components of an aspect of the present invention as the input stopper device is placed to a passing position such that the IC packages of the prior IC tube are transferred to the temperature soaking chamber.
Figure 11:
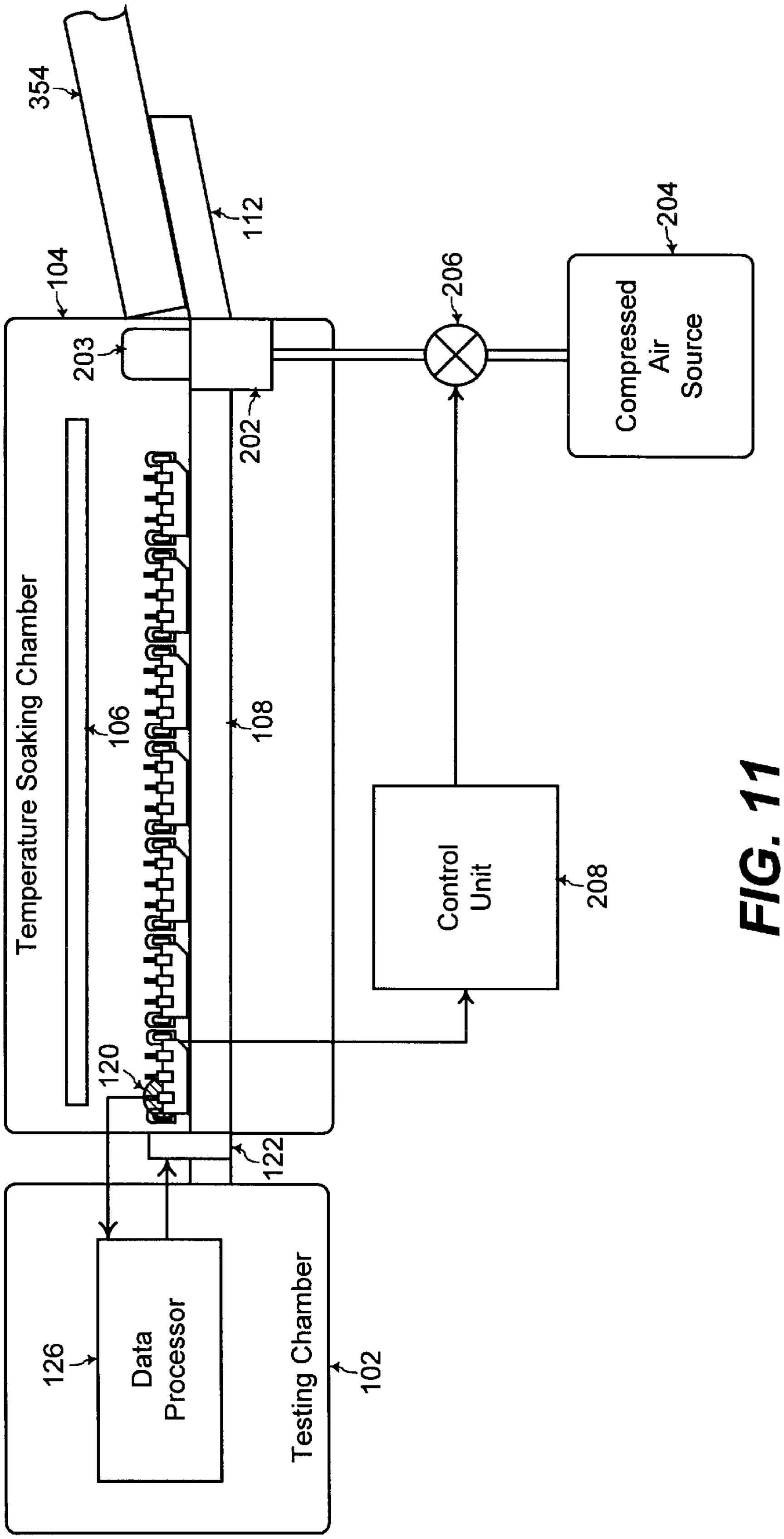
FIG. 11 show the side view of the temperature testing system of FIG. 10 after each of the IC packages of the prior IC tube has been transferred to the temperature soaking chamber.

With minimized amount of compressed air to the pneumatic cylinder 203, the pneumatic cylinder 203 is lowered to be at the passing position. Referring to FIG. 10, when the pneumatic cylinder 203 is lowered to be at the passing position, a prior plurality of IC packages within a prior IC tube 354 placed at the input 112 of the track 108 slides out from the prior IC tube 354 and onto the track 108 within the temperature soaking chamber 104. Referring to FIGS. 10 and 11, when each of the prior plurality of IC packages of the prior IC tube 354 are transferred to the track 108 within the soaking chamber 104, an IC package is adjacent the IC package detector 120.

In that case, the control signal at the I/P node 302 from the IC package detector turns to the "IC package PRESENT" (i.e., low) state at time point 352 in the timing diagram of FIG. 9. Referring to FIG. 9, after the control signal 332 at the I/P node 302 from the IC package detector turns to the "IC package PRESENT" (i.e., low) state at time point 352, the transition of the control signal 332 at the I/P node 302 from a high state to a low state causes the five second timer 304 to generate a pulse 356 that is high for a time period of five seconds for the control signal A (336 in FIG. 9). The control signal A turns high at the transition of the control signal 332 at the I/P node 302 from a high state to a low state. The control signal A is generated by the five second timer 304 and turns back low after five seconds from when the control signal A turned high. Timer circuits of the five second timer 304 for generating such a control signal A are known to one of ordinary skill in the art of electronics.

Further referring to FIG. 9, with generation of such a control signal A, the output control signal 346 at the output node 326 of the OR-gate 324 turns high at time point 358 which is five seconds after the transition of the control signal 332 at the I/P node 302 from a high state to a low state (i.e. time point 352). Referring to FIGS. 9 and 11, the output node 326 of the OR-gate 324 is coupled to the air valve 206, and when the output control signal at the output node 326 is high, the air valve 206 is opened to maximize the amount of compressed air to the pneumatic cylinder 203 of the input stopper device 202 from the compressed air source 204. With maximized amount of compressed air to the pneumatic cylinder 203, the pneumatic cylinder 203 is raised to be at the stopping position. The five second delay in the output control signal 346 turning high at time point 358 after the transition of the control signal 332 ensures that all of the prior plurality of IC packages of the prior IC tube 354 is transferred out of the prior IC tube 354 to the track 108 before the pneumatic cylinder 203 is raised to the stopping position.

Referring to FIG. 11, the IC package detector 120 also sends the "IC package PRESENT" control signal to the data processor 126 of the temperature testing system 200 as also described for the prior art temperature testing system 100. The data processor 126 then begins to time up to a predetermined time period from receiving the "IC package PRESENT" control signal to control the output stopper device 122 to be raised to a stopping position during the predetermined time period such that each of the plurality of IC packages of the prior IC tube 354 soaks up to the predetermined temperature within the soaking chamber 104 before being passed to the testing chamber 102.

Figure 12:
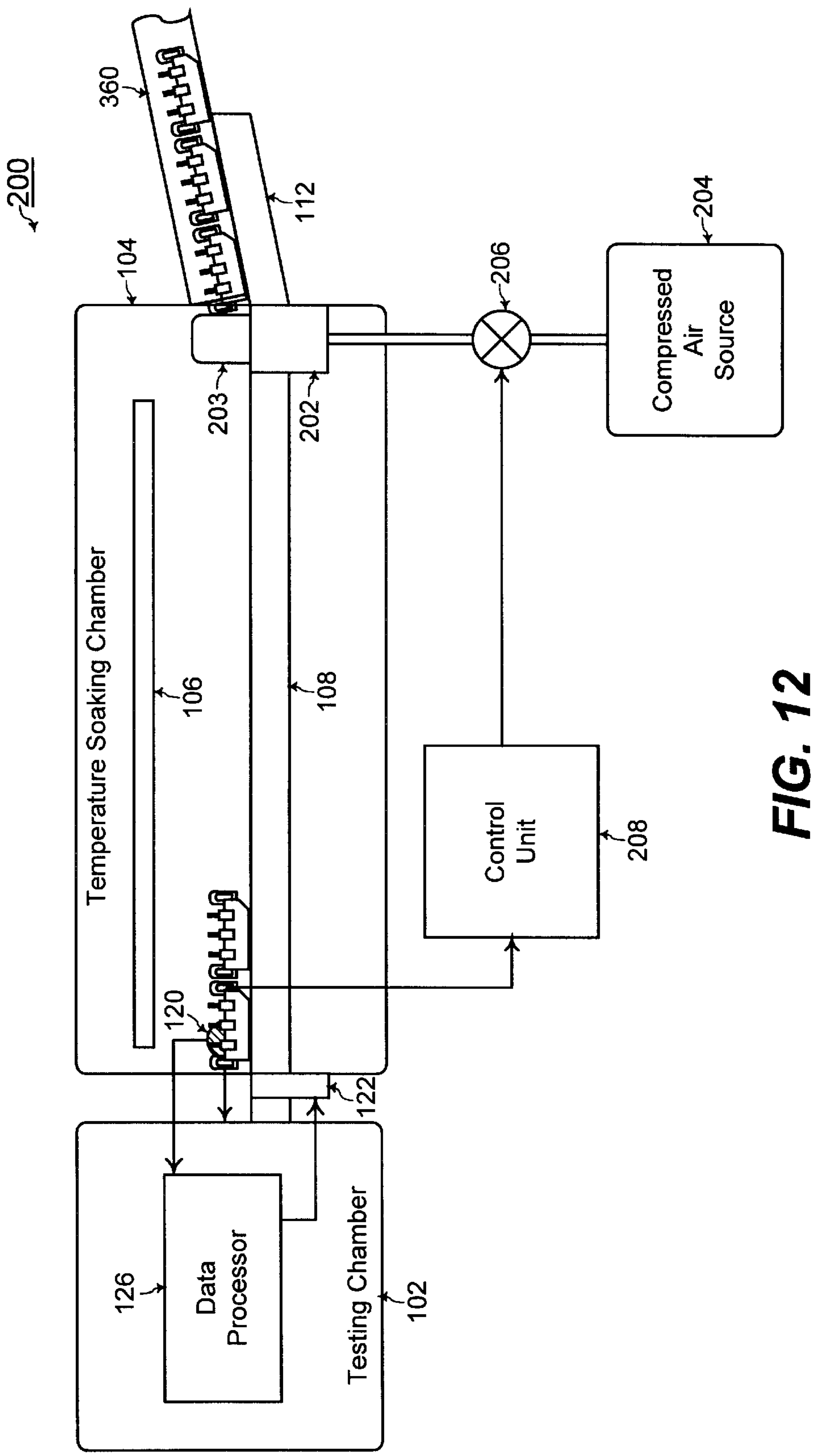
FIG. 12 shows the side view of the temperature testing system of FIG. 11 with the input stopper device being placed at a stopping position as each of the IC packages of the prior IC tube is being transferred to the testing chamber after the IC packages have been within the temperature soaking chamber for the predetermined time period.

Referring to FIG. 12, after the data processor 126 times up to the predetermined time period from receiving the "IC package PRESENT" control signal, the data processor 126 controls the output stopper device 122 to be lowered to a passing position such that each of the prior plurality of IC packages of the prior IC tube 354 is passed to the testing chamber 102. Each IC package passes adjacent the IC package detector 120 as the IC package is transferred from the soaking chamber 104 to the testing chamber 102. Thus, the I/P control signal from the IC package detector 120 remains in the "IC package PRESENT" (i.e., low in FIG. 9) state until each of the prior plurality of IC packages of the prior IC tube 354 is passed to the testing chamber 102. The IC package detector 120 determines whether any of the prior plurality of IC packages of the prior IC tube 354 is still within the soaking chamber 104.

Figure 13:
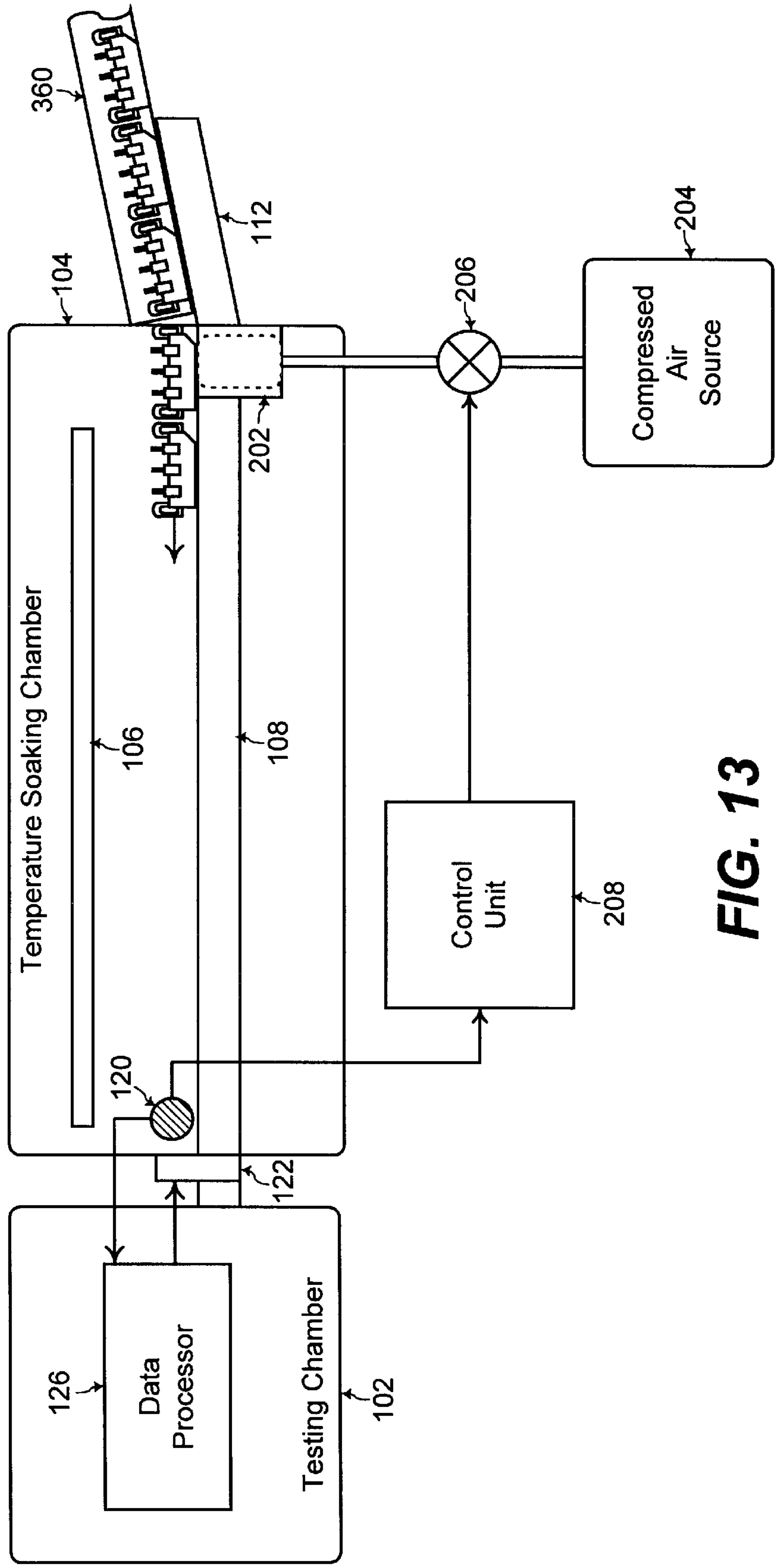
FIG. 13 shows the side view of the temperature testing system of FIG. 12 with the input stopper device being placed to a passing position after each of the IC packages of the prior IC tube has been transferred to the testing chamber.

Referring to FIG. 13, when each of the prior plurality of IC packages of the prior IC tube 354 has been passed to the testing chamber 102 from the soaking chamber 104, no IC package of the prior plurality of IC packages of the prior IC tube 354 is adjacent the IC package detector 120 within the soaking chamber 104. In that case, referring to FIG. 9, the I/P control signal from the IC package detector 120 transitions to the "IC package NOT PRESENT" (i.e., high in FIG. 9) state at time point 362. The time duration from time point 352 to the time point 362 depends on the predetermined time duration for soaking the IC packages within the soaking chamber 104 as timed by the data processor 126 (such as 4 minutes for the MCT3608E Handler available from Micro Component Technology, Inc. for example) and the time duration for transferring each of the prior plurality of IC packages of the prior IC tube 354 from the soaking chamber

104 to the testing chamber 102 (such as 6 minutes for the MCT3608E Handler available from Micro Component Technology, Inc. for example).

At time point 362 when the I/P control signal from the IC package detector 120 transitions from the low state to the high state, the ten second timer 308 generates a pulse 364 that is high for a time period of ten seconds for the control signal B (340 in FIG. 9). The control signal B turns high at the transition of the control signal 332 at the I/P node 302 from a low state to a high state. The control signal B is generated by the ten second timer 308 and turns back low after ten seconds from when the control signal B turned high. Timer circuits of the ten second timer 308 for generating such a control signal B are known to one of ordinary skill in the art of electronics.

Further referring to FIG. 9, with generation of such a control signal B, the output control signal 346 at the output node 326 of the OR-gate 324 turns low at time point 366 which is ten seconds after the transition of the control signal 332 at the I/P node 302 from a low state to a high state (i.e. time point 362). Referring to FIGS. 9 and 13, the output node 326 of the OR-gate 324 is coupled to the air valve 206, and when the output control signal at the output node 326 is low, the air valve 206 is closed to minimize the amount of compressed air to the pneumatic cylinder 203 of the input stopper device 202 from the compressed air source 204. With minimized amount of compressed air to the pneumatic cylinder 203, the pneumatic cylinder 203 is lowered to be at the passing position.

The ten second delay in the output control signal 346 turning low at time point 366 after the transition of the control signal 332 ensures that the output stopper device 122 is raised to the stopping position by the data processor 126 before the pneumatic cylinder 203 is lowered to the passing position. Referring to FIGS. 9 and 13, when each of the prior plurality of IC packages of the prior IC tube 354 has been passed to the testing chamber 102 from the soaking chamber 104, the IC package detector 120 also sends the "IC package NOT PRESENT" control signal at time point 362 to the data processor 126. The data processor 126 controls the output stopper device 122 to be raised to the stopping position within ten seconds from receiving the "IC package NOT PRESENT" control signal at time point 362 such that the output stopper device 122 is raised to the stopping position before the pneumatic cylinder 203 is raised to the passing position.

In this manner, referring to FIGS. 11, 12, and 13, each of the IC packages within a subsequent IC tube 360 placed at the input 112 of the track 108 is blocked by the pneumatic cylinder 203 of the input stopper device 202 from entering the temperature soaking chamber 104 until each of the IC packages of the prior IC tube 354 has been transferred to the testing chamber 102 and until the output stopper device 122 has been placed to the stopping position. Thus, any of the IC packages of the subsequent IC tube 360 is prevented from being transferred to the testing chamber 102 without being soaked within the soaking chamber 104 for the predetermined time period as the IC packages of the prior IC tube 354 are being transferred to the testing chamber 102.

After each of the IC packages of the prior IC tube 354 has been transferred to the testing chamber 102 from the soaking chamber 104 and after the output stopper device 122 has been placed to the stopping position, the input stopper device 202 is placed to the passing position such that the IC packages of the subsequent IC tube 360 may be transferred to the soaking chamber 104. The output stopper device 122 that is in the stopping position blocks the IC packages of the subsequent IC tube 360 from passing to the testing chamber 102. Then, after such IC packages have been within the soaking chamber 104 for the predetermined time period, the output stopper device 122 is placed to the passing position such that the IC packages of the subsequent IC tube 360 are transferred to the testing chamber 102. Thus, each of the IC packages of the prior IC tube 354 and the subsequent IC tube 360 is placed within the soaking chamber 104 for the predetermined time period before being transferred to the testing chamber 102 for testing of the IC packages at the proper temperature.

Referring to FIG. 9, the I/P control signal from the IC package detector 120 remains high from time point 362 until time point 368 while any of the IC packages of the subsequent IC tube 360 are adjacent the IC package detector 120 within the soaking chamber 104 for the predetermined time period and then as such IC packages are transferred to the testing chamber 102. When each of the IC packages of the subsequent IC tube 360 has been transferred to the testing chamber 102 with no IC package being adjacent the IC package detector 120, the I/P control signal from the IC package detector 120 transitions from a high state to a low state at time point 368, and the process repeats again as described from time point 352 for IC packages from another IC tube placed at the input 112.

The foregoing is by way of example only and is not intended to be limiting. For example, components of a temperature testing system 200 for ensuring that each IC package is soaked within the temperature soaking chamber 104 for the predetermined time period is described and illustrated for the first track 108 as an example track through the temperature soaking chamber 104. However, such respective components may be included for each of the tracks through the temperature soaking chamber 104 for ensuring that each IC package through each of the tracks is soaked within the temperature soaking chamber 104 for the predetermined time period before being transferred to the testing chamber 102, as would be apparent to one of ordinary skill in the art of IC package manufacture from the description herein for the example first track 108

The present invention is limited only as defined in the following claims and equivalents thereof.

We claim:

1. A system for ensuring that each of a plurality of IC (integrated circuit) packages are placed within a temperature soaking chamber for a predetermined time period before being transferred to a testing chamber, the system comprising:

an input stopper device disposed at an input of a track, wherein said track is disposed through said soaking chamber, and wherein a prior container holding a prior plurality of IC packages is placed at said input of said track such that said prior plurality of IC packages slides out of said prior container along said track into said soaking chamber when said input stopper device is at a passing position;

and wherein said prior plurality of IC packages is placed within the soaking chamber for said predetermined time period before each of said prior plurality of IC packages is transferred to said testing chamber when an output stopper device at an output of said track within said soaking chamber is placed to a passing position; and a control unit, coupled to said input stopper device, for controlling said input stopper device to be at a stopping position when any of said prior plurality of IC packages is within said soaking chamber and has not been transferred to said testing chamber such that each of a subsequent plurality of IC packages within a subsequent container is blocked, by said input stopper device, to be contained within said subsequent container placed at said input of said track until each of said prior plurality of IC packages within said soaking chamber has been transferred to said testing chamber;

and wherein said control unit controls said input stopper device to be at said passing position after each of said prior plurality of IC packages has been transferred to said testing chamber and after said output stopper device is placed to a stopping position such that each of said subsequent plurality of IC packages slides from said subsequent container along said track into said soaking chamber and such that each of said subsequent plurality of IC packages is blocked by said output stopper device from being transferred to said testing chamber until said subsequent plurality of IC packages has been within said soaking chamber for said predetermined time period.

2. The system of claim 1, further comprising:

an IC package detector disposed at said output of said track within said soaking chamber for detecting whether an IC package is present at said output of said track within said soaking chamber;

wherein said control unit controls said input stopper device to be at said stopping position when said IC package detector detects that an IC package is present at said output of said track indicating that any of said prior plurality of IC packages is within said soaking chamber;

and wherein said output stopper device is placed to a stopping position after said IC package detector detects that no IC package is present at said output of said track;

and wherein said control unit controls said input stopper device to be at said passing position when said IC package detector detects that no IC package is present at said output of said track and after said output stopper device has been placed to said stopping position.

3. The system of claim 2, wherein said control unit includes a 5 second timer such that said input stopper device is placed to said stopping position about 5 seconds after said IC package detector begins to detect that an IC package is at said output of said track within said soaking chamber such that all of said prior plurality of IC packages is placed within said soaking chamber before said input stopper device is placed to said stopping position.

4. The system of claim 2, wherein said control unit includes a 10 second timer such that said input stopper device is placed to said passing position about 10 seconds after said IC package detector begins to detect that no IC package is at said output of said track within said soaking chamber such that said output stopper device is put to said stopping position before said input stopper device is placed to said passing position.

5. The system of claim 1, wherein said input stopper device is a pneumatic cylinder, disposed at said input of said track, that is raised to be at said stopping position and that is lowered to be at said passing position.

6. A system for ensuring that each of a plurality of IC (integrated circuit) packages are placed within a temperature soaking chamber for a predetermined time period before being transferred to a testing chamber, the system comprising:

an input stopper device disposed at an input of a track, wherein said track is disposed through said soaking chamber, and wherein a prior container holding a prior plurality of IC packages is placed at said input of said track such that said prior plurality of IC packages slides out of said prior container along said track into said soaking chamber when said input stopper device is at a passing position;

and wherein said prior plurality of IC packages is placed within the soaking chamber for said predetermined time period before each of said prior plurality of IC packages is transferred to said testing chamber when an output stopper device at an output of said track within said soaking chamber is placed to a passing position;

means for controlling said input stopper device to be at a stopping position when any of said prior plurality of IC packages is within said soaking chamber and has not been transferred to said testing chamber such that each of a subsequent plurality of IC packages within a subsequent container is blocked, by said input stopper device, to be contained within said subsequent container placed at said input of said track until each of said prior plurality of IC packages within said soaking chamber has been transferred to said testing chamber until said subsequent plurality of IC packages has been within said soaking chamber for said predetermined time period; and means for controlling said input stopper device to be at said passing position after each of said prior plurality of IC packages has been transferred to said testing chamber and after said output stopper device is placed to a stopping position such that each of said subsequent plurality of IC packages slides from said subsequent container along said track into said soaking chamber and such that each of said subsequent plurality of IC packages is blocked by said output stopper device from being transferred to said testing chamber.

7. The system of claim 6, further comprising:

an IC package detector disposed at said output of said track within said soaking chamber for detecting whether an IC package is present at said output of said track within said soaking chamber;

means for controlling said input stopper device to be at said stopping position when said IC package detector detects that an IC package is present at said output of said track indicating that any of said prior plurality of IC packages is within said soaking chamber;

and wherein said output stopper device is placed to a stopping position after said IC package detector detects that no IC package is present at said output of said track; and means for controlling said input stopper device to be at said passing position when said IC package detector detects that no IC package is present at said output of said track and after said output stopper device has been placed to said stopping position.

8. The system of claim 7, further comprising:

means for controlling said input stopper device to be placed to said stopping position about 5 seconds after said IC package detector begins to detect that an IC package is at said output of said track within said soaking chamber such that all of said prior plurality of IC packages is placed within said soaking chamber before said input stopper device is placed to said stopping position.

9. The system of claim 7, further comprising:

means for controlling said input stopper device to be placed to said passing position about 10 seconds after said IC package detector begins to detect that no IC package is at said output of said track within said soaking chamber such that said output stopper device is put to said stopping position before said input stopper device is placed to said passing position.

10. The system of claim 6, wherein said input stopper device is a pneumatic cylinder, disposed at said input of said track, that is raised to be at said stopping position and that is lowered to be at said passing position.

11. A method for ensuring that each of a plurality of IC (integrated circuit) packages are placed within a temperature soaking chamber for a predetermined time period before being transferred to a testing chamber, the system comprising:

controlling an input stopper device disposed at an input of a track to be placed to a passing position, wherein said track is disposed through said soaking chamber, such that a prior plurality of IC packages from a prior container placed at said input of said track slides out of said prior container along said track into said soaking chamber;

wherein said prior plurality of IC packages are soaked within the soaking chamber for said predetermined time period before each of said prior plurality of IC packages is transferred to said testing chamber when an output stopper device at an output of said track within said soaking chamber is placed to a passing position;

controlling said input stopper device to be at a stopping position when any of said prior plurality of IC packages is within said soaking chamber and has not been transferred to said testing chamber such that each of a subsequent plurality of IC packages within a subsequent container is blocked, by said input stopper device, to be contained within said subsequent container placed at said input of said track until each of said prior plurality of IC packages within said soaking chamber has been transferred to said testing chamber; and controlling said input stopper device to be at said passing position after each of said prior plurality of IC packages has been transferred to said testing chamber and after said output stopper device is placed to a stopping position such that each of said subsequent plurality of IC packages slides from said subsequent container along said track into said soaking chamber and such that each of said subsequent plurality of IC packages is blocked by said output stopper device from being transferred to said testing chamber until said subsequent plurality of IC packages has been within said soaking chamber for said predetermined time period.

12. The method of claim 11, further including the steps of:

detecting whether an IC package is present at said output of said track within said soaking chamber;

controlling said input stopper device to be at said stopping position when an IC package is detected to be present at said output of said track indicating that any of said prior plurality of IC packages is within said soaking chamber;

wherein said output stopper device is placed to a stopping position after said IC package detector detects that no IC package is present at said output of said track; and controlling said input stopper device to be at said passing position when no IC package is detected to be present at said output of said track and after said output stopper device has been placed to said stopping position.

13. The method of claim 12, further including the step of:

controlling said input stopper device to be placed to said stopping position about 5 seconds after an IC package is detected at said output of said track within said soaking chamber such that all of said prior plurality of IC packages is placed within said soaking chamber before said input stopper device is placed to said stopping position.

14. The method of claim 12, further including the step of:

controlling said input stopper device to be placed to said passing position about 10 seconds after no IC package is detected at said output of said track within said soaking chamber such that said output stopper device is put to said stopping position before said input stopper device is placed to said passing position.

15. The method of claim 11, wherein said input stopper device is a pneumatic cylinder disposed at said input of said track, and wherein said method further includes the steps of:

raising said pneumatic cylinder to be at said stopping position to block any IC packages from passing to said soaking chamber from a container placed at said input of said track; and lowering said pneumatic cylinder to be at said passing position to transfer IC packages to said soaking chamber from a container placed at said input of said track.

* * * * *